(12) United States Patent
Yoshitomi et al.

(10) Patent No.: US 6,998,663 B2
(45) Date of Patent: Feb. 14, 2006

(54) SEMICONDUCTOR DEVICE HAVING CAPACITOR AND METHOD OF MANUFACTURING THE SAME

(75) Inventors: Takashi Yoshitomi, Kamakura (JP); Masahiko Matsumoto, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 37 days.

(21) Appl. No.: 10/770,489

(22) Filed: Feb. 4, 2004

(65) Prior Publication Data

US 2004/0155273 A1 Aug. 12, 2004

Related U.S. Application Data

(62) Division of application No. 10/263,186, filed on Oct. 3, 2002, now Pat. No. 6,746,929, which is a division of application No. 09/813,986, filed on Mar. 22, 2001, now abandoned.

(30) Foreign Application Priority Data

Mar. 28, 2000 (JP) .............................. 2000-089290

(51) Int. Cl.
  *H01L 27/108* (2006.01)
  *H01L 29/76* (2006.01)
  *H01L 29/94* (2006.01)
  *H01L 31/119* (2006.01)
(52) U.S. Cl. .................. 257/296; 257/303; 257/306
(58) Field of Classification Search ............. 257/296, 257/303, 306, 310, 532
See application file for complete search history.

(56) References Cited

U.S. PATENT DOCUMENTS

| 5,874,770 | A | 2/1999 | Saia et al. |
| 6,066,868 | A | 5/2000 | Evans, Jr. |
| 6,180,976 | B1 | 1/2001 | Roy |
| 6,459,562 | B1 | 10/2002 | KarRoy et al. |
| 6,657,247 | B1 * | 12/2003 | Yoshiyama et al. ......... 257/303 |

FOREIGN PATENT DOCUMENTS

| JP | 2-162731 | 6/1990 |
| JP | 3-174729 | 7/1991 |
| JP | 7-130733 | 5/1995 |

OTHER PUBLICATIONS

R. Mahnkopr, et al., "System on a Chip" Technology Platform for 0.18 μm Digital, Mixed Signal & eDRAM Applications, Proceeding of IEDM Technology Digest 849, 1999, pp. 1-4.

* cited by examiner

*Primary Examiner*—Hoai Pham
(74) *Attorney, Agent, or Firm*—Oblon, Spivak, McClelland, Maier & Neustadt, P.C.

(57) ABSTRACT

A semiconductor device, comprising a first wiring formed in a first insulating film, a second insulating film formed on the first insulating film, a first electrode film selectively formed on the second insulating film, a third insulating film formed on the first electrode film, and having an end portion and a central portion, wherein the end portion has a thickness thinner than the central portion, a second electrode film formed on the central portion of the third insulating film such that the second electrode film faces the first electrode film.

3 Claims, 6 Drawing Sheets

1

SEMICONDUCTOR DEVICE HAVING CAPACITOR AND METHOD OF MANUFACTURING THE SAME

CROSS-REFERENCE TO RELATED APPLICATIONS

This application is a division of and claims the benefit of priority under 35 USC §120 from U.S. application Ser. No. 10/263,186, filed Oct. 3, 2002, now U.S. Pat. No. 6,746,929 and is based upon and claims the benefit of priority under 35 USC §119 from Japanese Patent Application No. 2000-089290, filed Mar. 28, 2000, the entire contents of which are incorporated herein by reference.

BACKGROUND OF THE INVENTION

The present invention relates to a semiconductor device having a capacitor and a method of manufacturing the same.

In recent years, proposed is a semiconductor device using a Cu wiring of a damascene structure in accordance with progress in the fineness of the element.

FIG. 16 is a cross sectional view showing a conventional semiconductor device of a damascene structure. As shown in the drawing, a first wiring 62 made of, for example, Cu is formed in a $SiO_2$ film 61, and a dielectric film 63 is formed on the first wiring 62. Further, an upper electrode 64 is formed on the dielectric film 63. Still further, a via hole 66 connected to the upper electrode 64 is formed in an interlayer insulating film 65, and a second wiring 67 made of, for example, Cu, which is connected to the via hole 66, is formed on the interlayer insulating film 65.

In the conventional semiconductor device of the construction described above, the first wiring 62, the dielectric film 63 and the upper electrode 64 collectively form a capacitor 68. In other words, the first wiring 62 buried in the $SiO_2$ film 61 plays the role of the lower electrode of the capacitor 68. The first wiring 62 is hereinafter referred to as a lower electrode.

However, in the conventional semiconductor device of the construction described above, the capacitance of the capacitor 68 is determined by the surface area of any of the lower electrode 62 and the upper electrode 64 having a smaller surface area. Therefore, where a capacitor having a large capacitance is required, it is necessary to enlarge the surface area of not only the upper electrode 64 but also the lower electrode 62. Such being the situation, it was very difficult to form a capacitor having a large capacitance while promoting the fineness of the element.

FIG. 17 shows in a magnified fashion the portion B shown in FIG. 16. As shown in FIG. 17, an edge portion 64a of the upper electrode 64 on the side of the dielectric film 63 forms an acute angle, with the result that the electric field is concentrated on the edge portion 64a, giving rise to a problem that the reliability of the element is lowered.

Further, although many of the capacitors used as analog passive elements are capacitors fixed at one kind of capacitance, there is a case where it is required to form within a single layer a plurality of capacitors having various capacitance values. For example, in order to cope with the pairing problem of the capacitors which occur nonuniform capacitance values that the capacitance values are rendered nonuniform among the capacitors, it is considered effective to diminish the influence given by the nonuniform capacitance values. However, if the area of the capacitor is increased, the delay time accompanying the charging is rendered long, making it necessary to diminish the capacitance per unit area of the capacitor because the capacitor having a small capacitance permits shortening the charging time so as to shorten the delay time accompanying the charging. For meeting such demands, it has become necessary to form a plurality of capacitors having at least two kinds of capacitance values within a single layer without increasing the chip area.

As described above, it was very difficult in the conventional semiconductor device to form a plurality of capacitors having a large capacitance or at least two kinds of capacitance values while promoting the fineness of the element. An additional problem to be noted is that an electric field is concentrated in an edge portion of the electrode so as to lower the reliability of the element.

BRIEF SUMMARY OF THE INVENTION

An object of the present invention, which has been achieved for overcoming the above-noted problems inherent in the prior art, is to provide a semiconductor device, which permits forming a capacitor having a large capacitance or a plurality of capacitors having at least two kinds of capacitance values while promoting the fineness of the element, and which also permits moderating the electric field concentration, and a method of manufacturing the same.

The particular object of the present invention can be achieved by the means described below.

According to a first aspect of the present invention, there is provided a first semiconductor device, comprising a first wiring formed in a first insulating film; a second insulating film formed on the first insulating film; a first electrode film selectively formed on the second insulating film; a third insulating film formed on the first electrode film, and having an end portion and a central portion, wherein the end portion has a thickness thinner than the central portion; a second electrode film formed on the central portion of the third insulating film such that the second electrode film faces the first electrode film; a fourth insulating film formed on the second electrode film and the end portion of the third insulating film; a fifth insulating film formed on the fourth insulating film; a sixth insulating film formed on the fifth insulating film; a seventh insulating film formed on the first interlayer insulating film; second, third and fourth wirings formed in the seventh insulating film; a first connecting member formed in the sixth, fifth and fourth insulating films to electrically connect the second wiring to the second electrode film; a second connecting member formed in the sixth, fifth and fourth insulating films and the end portion of the third insulating film to electrically connect the third wiring to the first electrode film; and a third connecting member formed in the sixth and second insulating films to electrically connect the fourth wiring to the first wiring.

The first and second electrode films and the third insulating film form a capacitor.

It is desirable for the side surface of the second connecting member is only in contact with the fourth and fifth insulating films.

Further, it is desirable for the seventh insulating film to be formed of an insulating film having a low dielectric constant.

Also, it is desirable for the second, fourth and fifth insulating films are a diffusion preventing film.

According to a second aspect of the present invention, there is provided a second semiconductor device, comprising a first wiring formed in a first insulating film; a second insulating film formed on the first insulating film; a first electrode film selectively formed on the second insulating film; a third insulating film selectively formed on the first electrode film and the second insulating film; a second electrode film formed on the third insulating film such that the second electrode film faces the first electrode film; a second wiring formed on the second electrode film; a third wiring formed on the second insulating film and positioned apart from the second wiring; a first connecting member formed in the second insulating film to electrically connect the first electrode film to the first wiring; and a second connecting member formed in the second insulating film to electrically connect the third wiring to the first wiring.

The first and second electrode films and the third insulating film form a capacitor.

According to a third aspect of the present invention, there is provided a third semiconductor device, comprising a first wiring formed in a first insulating film; a second insulating film formed on the first insulating film; a first electrode film selectively formed on the second insulating film in a manner to overlap partially with the first wiring; a third insulating film selectively formed on the first electrode film; a second electrode film formed on the third insulating film such that the second electrode film faces the first electrode film; a fourth insulating film formed on the first and second electrode films and the second insulating film; a fifth insulating film formed on the fourth insulating film; second, third and fourth wirings formed in the fifth insulating film; a first connecting member formed in the fourth and second insulating films to electrically connect the second wiring to the first wiring; a second connecting member formed in the fourth insulating film to electrically connect the third wiring to the second electrode film; and a third connecting member formed in the fourth insulating film to electrically connect the fourth wiring to the first electrode film.

The first wiring, the first electrode film and the second insulating film form a first capacitor, and the first and second electrodes and the third insulating film form a second capacitor, the first and second capacitors differing from each other in the capacitance.

It is desirable for the fifth insulating film to be formed of an insulating film having a low dielectric constant.

According to a fourth aspect of the present invention, there is provided a method of manufacturing the first semiconductor device, comprising the steps of forming a first wiring in a first insulating film; forming a second insulating film on the first insulating film; forming a first electrode film on the second insulating film; forming a third insulating film on the first electrode film, and having an end portion and a central portion; forming a second electrode film on the third insulating film; removing the second electrode film and the third insulating film to an extent that the first electrode film is not exposed to the outside, and forming the end portion of the third insulating film thinner than the central portion of the third insulating film; forming a fourth insulating film on the second insulating film and the end portion of the third insulating film; selectively removing the fourth insulating film, the end portion of the third insulating film and the first electrode film; forming a fifth insulating film on the fourth and second insulating films; forming a sixth insulating film on the fifth insulating film; forming a seventh insulating film on the sixth insulating film; forming a first connecting member electrically connected to the second electrode film within the sixth, fifth and fourth insulating films, forming a second connecting member electrically connected to the first electrode film within the sixth, fifth and fourth insulating films and the end portion of the third insulating film and forming a third connecting member electrically connected to the first wiring within the sixth, fifth and second insulating films; and forming second, third and fourth wirings connected to the first, second and third connecting members within the seventh insulating film.

According to a fifth aspect of the present invention, there is provided a method of manufacturing the second semiconductor device, comprising the steps of forming a first wiring in a first insulating film; forming a second insulating film on the first insulating film; forming first and second connecting members electrically connected to the first wiring within the second insulating film; forming a first electrode film connected to the first connecting member on the second insulating film; forming a third insulating film on the first electrode film and the second insulating film; forming a second electrode film on the third insulating film; selectively removing the second electrode film and the third insulating film so as to expose the second connecting member; and forming a second wiring on the second electrode film and forming a third wiring positioned apart from the second wiring and connected to the second connecting member on the second insulating film.

According to a sixth aspect of the present invention, there is provided a method of manufacturing the third semiconductor device, comprising the steps of forming a first wiring in a first insulating film; forming a second insulating film on the first insulating film; selectively forming a first electrode film on the second insulating film in a manner to overlap partially with the first wiring; selectively forming a third insulating film on the first insulating film; forming a second electrode film on the third insulating film; forming a fourth insulating film on the first and second electrode films and the second insulating film; forming a fifth insulating film on the fourth insulating film; forming a first connecting member electrically connected to the first wiring within the fourth and second insulating films, forming a second connecting member electrically connected to the second electrode film within the fourth insulating film and forming a third connecting member electrically connected to the first electrode film within the fourth insulating film; and forming second, third and fourth wirings connected to the first, second and third connecting members within the fifth insulating film.

According to the present invention described above, it is possible to provide a semiconductor device, which permits forming a capacitor having a large capacitance or a plurality of capacitors having at least two kinds of capacitance values while promoting the fineness of the element, and which also permits moderating the electric field concentration, and a method of manufacturing the particular semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

[First Embodiment]

The first embodiment of the present invention is directed to a semiconductor device having a Cu wiring of a damascene structure and is featured in that a capacitor is formed separately from the Cu wiring.

FIGS. 1 to 6A are cross sectional views showing the manufacturing process of a semiconductor device according to the first embodiment of the present invention. The manufacturing method of the semiconductor device according to the first embodiment of the present invention will now be described with reference to FIGS. 1 to 6A.

Figure 1:
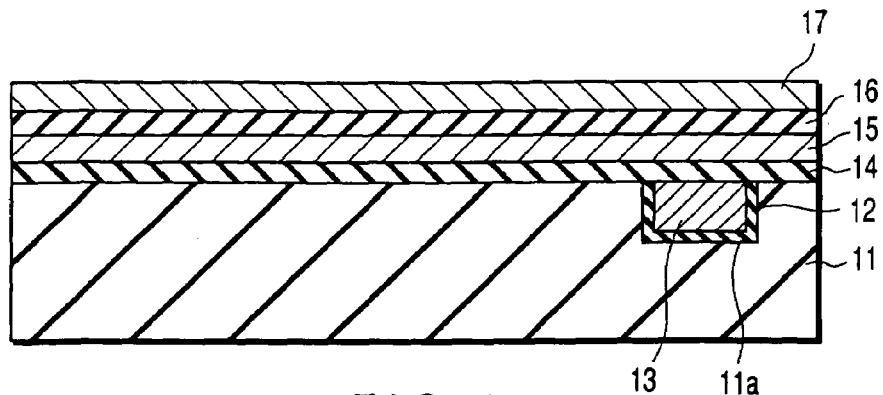
FIG. 1 is a cross sectional view showing a manufacturing step of a semiconductor device according to a first embodiment of the present invention.

In the first step, a wiring groove 11a is formed in a $SiO_2$ film 11, followed by forming a barrier metal layer 12 in the wiring groove 11, as shown in FIG. 1. A wiring material layer such as a Cu layer is formed on the barrier metal layer 12 so as to fill the wiring groove 11a. Then, the wiring material layer and the barrier metal layer 12 are planarized by, for example, a CMP (Chemical Mechanical Polish) method until the surface of the $SiO_2$ film 11 is exposed to the outside so as to form a first wiring 13 buried in the $SiO_2$ film 11.

In the next step, a Cu diffusion preventing film 14 made of, for example, a SiN film is formed on the $SiO_2$ film 11, followed by forming a lower electrode film 15 made of, for example, a TiN film is formed on the Cu diffusion preventing film 14. Further, a dielectric film 16 made of, for example, a $Ta_2O_5$ film is formed on the lower electrode film 15, followed by forming an upper electrode film 17 made of, for example, a TiN film on the dielectric film 16. It should be noted that the Cu diffusion preventing film 14 is formed in a thickness of, for example, 50 nm, the lower electrode film 15 is formed in a thickness of, for example, 60 nm, the dielectric film 16 is formed in a thickness of, for example, 50 nm, and the upper electrode film 17 is formed in a thickness of, for example, 50 nm.

Figure 2:
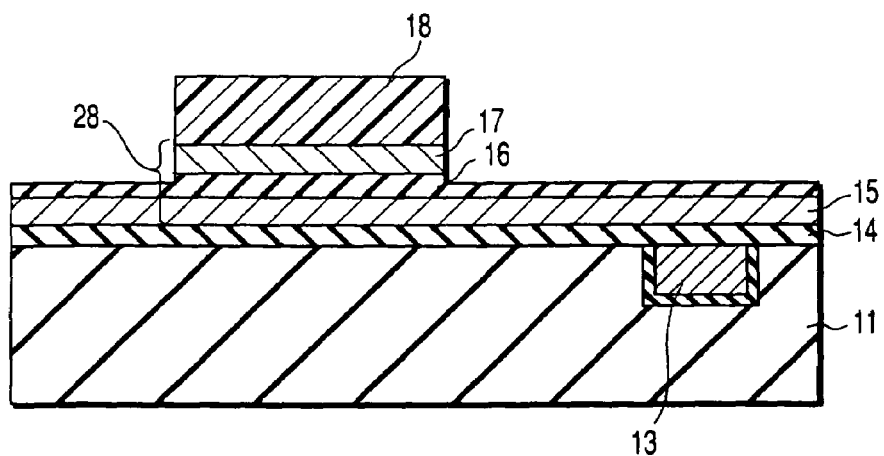
FIG. 2 is a cross sectional view showing a manufacturing step, following the step shown in FIG. 1, of a semiconductor device according to the first embodiment of the present invention.

Then, the upper electrode film 17 is coated with a resist film 18, followed by patterning the resist film 18 by means of photolithography, as shown in FIG. 2. Further, the upper electrode film 17 is selectively removed by RIE (Reactive Ion Etching) with the patterned resist film 18 used as a mask. In the step of selectively removing the upper electrode film 17, the dielectric film 16 is also removed partly in a thickness of, for example, 30 nm. As a result, an end portion of the dielectric film 16 is thinner than a central portion of the dielectric film 16. In this fashion, formed is a capacitor 28 consisting of the upper electrode film 17, the dielectric film 16 and the lower electrode film 15. Then, the resist film 18 is removed.

Figure 3:
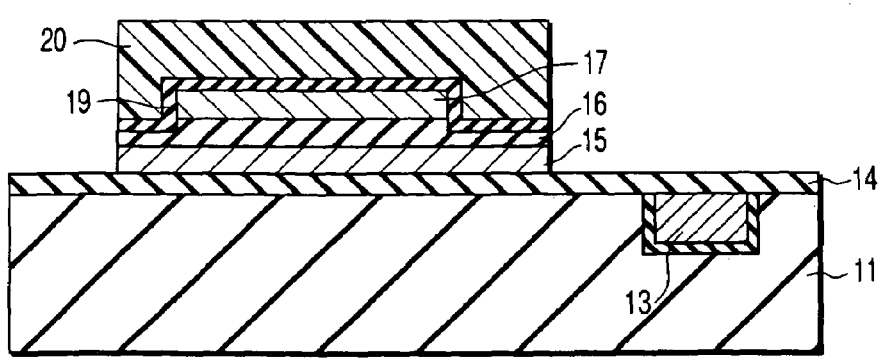
FIG. 3 is a cross sectional view showing a manufacturing step, following the step shown in FIG. 2, of a semiconductor device according to the first embodiment of the present invention.

In the next step, a SiN film 19 is formed on the upper electrode film 17 and the dielectric film 16, as shown in FIG. 3, followed by coating the SiN film 19 with a resist film 20 and subsequently patterning the resist film 20 by means of photolithography. Then, the SiN film 19, the dielectric film 16 and the lower electrode film 15 are selectively removed by RIE with the patterned resist film 20 used as a mask so as to expose the surface of the Cu diffusion preventing film 14 to the outside. Further, the resist film 20 is removed.

Figure 4:
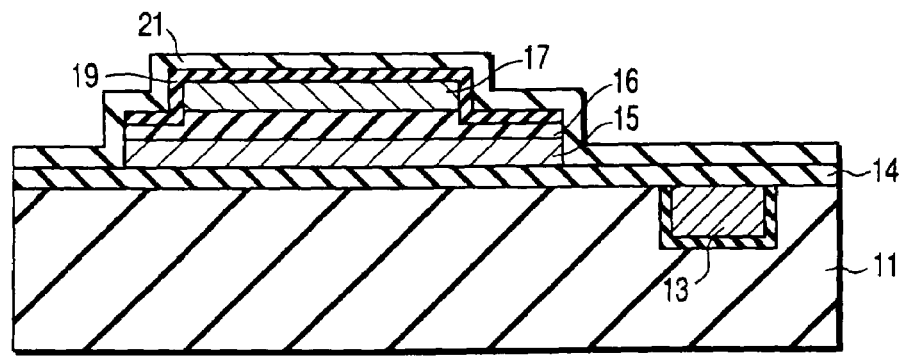
FIG. 4 is a cross sectional view showing a manufacturing step, following the step shown in FIG. 3, of a semiconductor device according to the first embodiment of the present invention.

Then, a SiN film 21 is formed on the SiN film 19 and the Cu diffusion preventing film 14, as shown in FIG. 4. It should be noted that the sum of the thickness of the SiN film 19 and the thickness of the SiN film 21 is, for example, about 50 nm.

Figure 5:
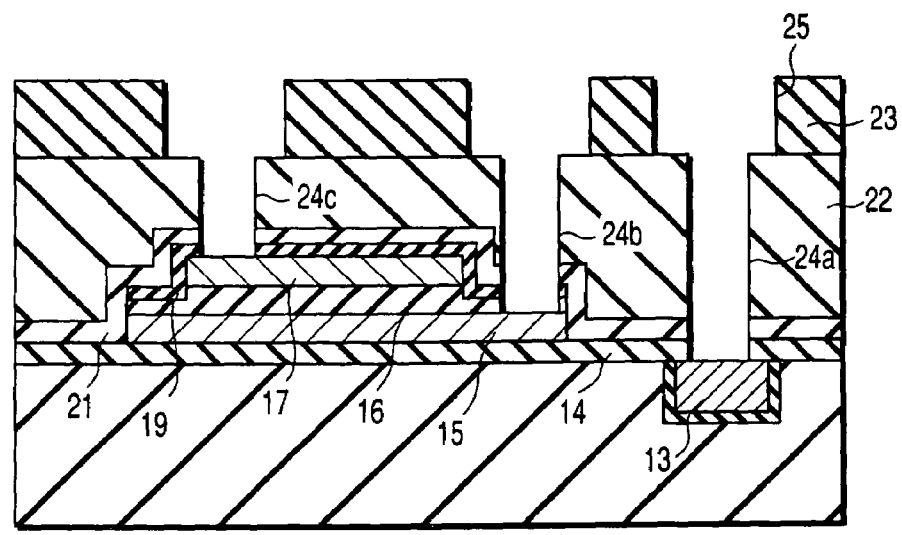
FIG. 5 is a cross sectional view showing a manufacturing step, following the step shown in FIG. 4, of a semiconductor device according to the first embodiment of the present invention.

After formation of the SiN film 21, a first interlayer insulating film 22 made of, for example, a $SiO_2$ film is formed on the SiN film 21 by a PECVD (Plasma Enhances Chemical Vapor Deposition) method, followed by planarizing the first interlayer insulating film 22 by a CMP method, as shown in FIG. 5. Then, a second interlayer insulating film 23 is formed on the planarized first interlayer insulating film 22. The second interlayer insulating film 23 is formed of an insulating film having a low dielectric constant such as a SiN film. As a result, it is possible to decrease the capacitance between the wirings. The low dielectric constant is a relative dielectric constant of less than 4.0.

In the next step, the first interlayer insulating film 22 is selectively removed by the photolithography and RIE so as to form via holes 24a, 24b, 24c in the first interlayer insulating film 22. It should be noted that the via hole 24a is connected to the first wiring 13, and the via hole 24b is connected to the lower electrode film 15. Further, the via hole 24c is connected to the upper electrode film 17.

In the next step, the second interlayer insulating film 23 is selectively etched so as to form wiring grooves 25, which are positioned on the via holes 24a, 24b, 24c, in the second interlayer insulating film 23.

Figure 6A:
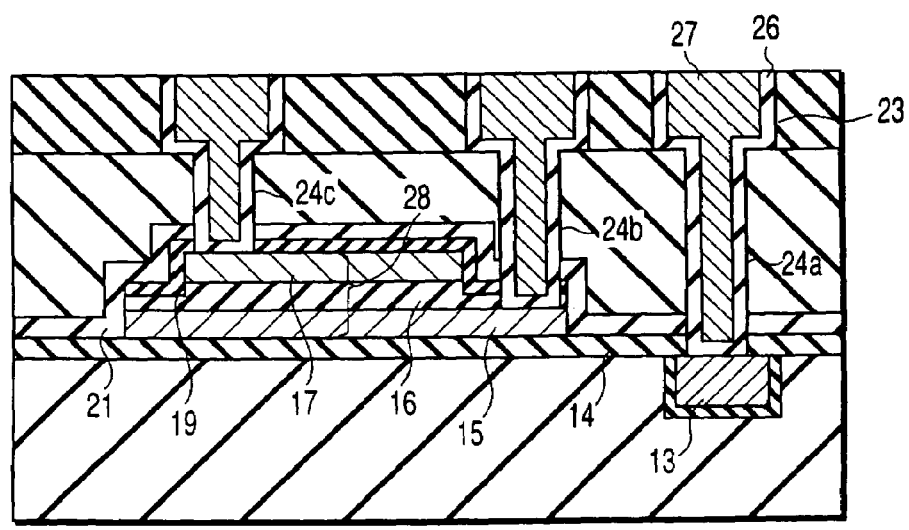
FIG. 6A is a cross sectional view showing a manufacturing step, following the step shown in FIG. 5, of a semiconductor device according to the first embodiment of the present invention.

Then, a barrier metal layer 26 made of, for example, TaN is formed on the via holes 24a, 24b, 24c and the wiring grooves 25, as shown in FIG. 6A, followed by forming a wiring material layer such as a Cu layer on the barrier metal layer 26 so as to permit the via holes 24a, 24b, 24c and the wiring grooves 25 to be filled with the wiring material. Further, the barrier metal layer 26 and the wiring material layer are planarized by, for example, a CMP method until the surface of the second interlayer insulating film 23 is exposed to the outside, thereby forming a second wiring 27.

According to the first embodiment described above, the first wiring 13 is not used as the lower electrode of a capacitor, and the capacitor 28 is formed separately from the first wiring 13. It follows that it is possible to form a capacitor having a large capacitance by simply adjusting the areas of the lower electrode 15 and the upper electrode 17 without enlarging the first wiring 13 so as to facilitate the promotion of the fineness of the element.

It should also be noted that it is possible to form the end portion of the dielectric film 16 has a thickness thinner than the central portion of the dielectric film 16 by stopping the etching before the dielectric film 16 is etched completely. As a result, it is possible to prevent formation of a leak current path to the lower electrode 15 from an end portion of the upper electrode 17, thereby moderating the electric field concentration in the edge portion of the upper electrode 17, compared with the case where the dielectric film 16 is etched completely.

Also, the insulating films 19, 21 are formed on the capacitor 28, it is possible to prevent the contamination with Cu to the dielectric film 16 of the capacitor 28 from the second wiring 27 and the via holes 24a, 24b, 24c.

Also, the Cu diffusion preventing film 14 is formed below the capacitor 28, it is possible to prevent the contamination with Cu to an element (not shown) formed below the capacitor 28 from the second wiring 27 and the via holes 24a, 24b, 24c.

It should also be noted that, since the capacitor 28 is formed separately from the first wiring 13, it suffices to form the first wiring 13 only below the via hole 24a. Where the surface area of the first wiring 62 is large as in the prior art, the problem that the area of the dielectric film 63 is limited by the reduction in the thickness of the first wiring 62 is rendered prominent. In the present invention, however, the surface area of the first wiring 13 can be made smaller than in the prior art, making it possible to suppress the problem in respect of the reduction in the thickness of the wiring. Further, even if the Cu diffusion preventing film 14 has a high dielectric constant, it is possible to diminish the parasitic capacitance because the first wiring 13 is formed only partly.

Figure 6B:
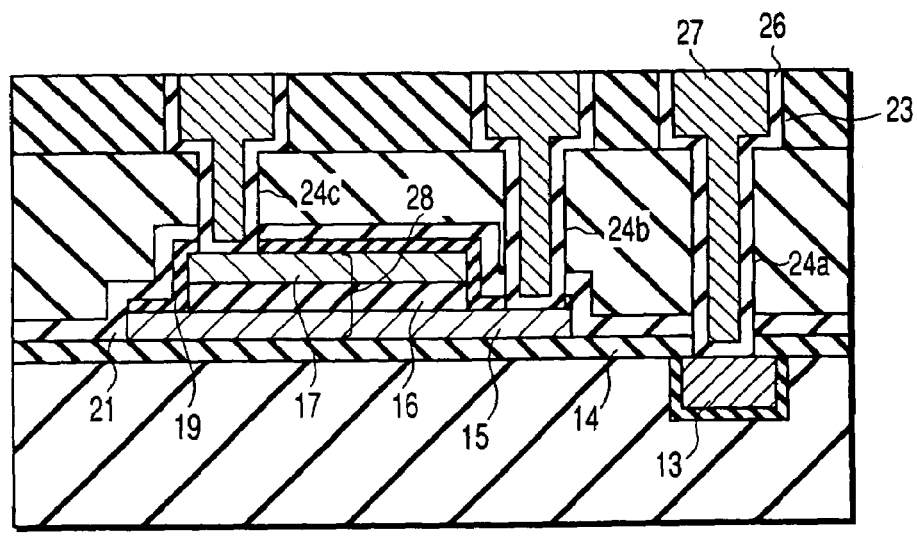
FIG. 6B is a cross sectional view showing a modification of the semiconductor device according to the first embodiment of the present invention.

Incidentally, in the first embodiment, the side surface of the via hole 24b is in contact with the silicon nitride films 19, 21 and the dielectric film 16. However, the present invention is not limited to the particular construction. For example, it is possible for the dielectric film 16 to be formed in a part on the lower electrode 15 such that the side surface of the via hole 24b is only in contact with the silicon nitride films 19, 21 as shown in FIG. 6B. In this case, it is possible to obtain the merit that the via holes 24a, 24b, 24c can be formed under the same process conditions (etching conditions).

[Second Embodiment]

The second embodiment is directed to a semiconductor device having an Al wiring and is featured in that the lower electrode of a capacitor is covered with a dielectric film and the upper electrode.

Figure 7:
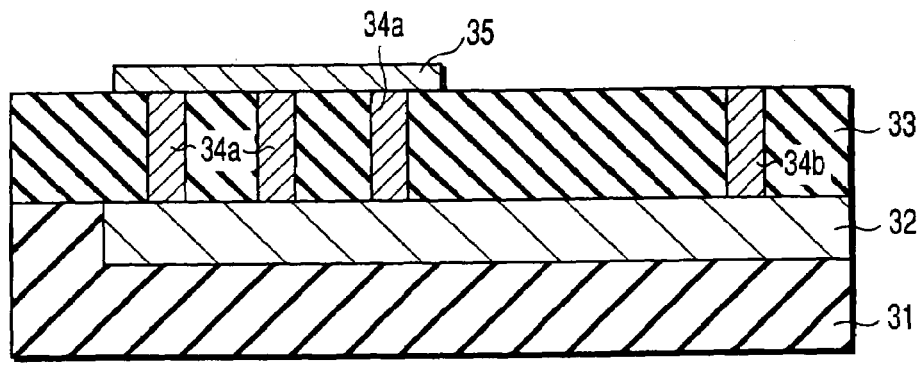
FIG. 7 is a cross sectional view showing a manufacturing step of a semiconductor device according to a second embodiment of the present invention.
Figure 8:
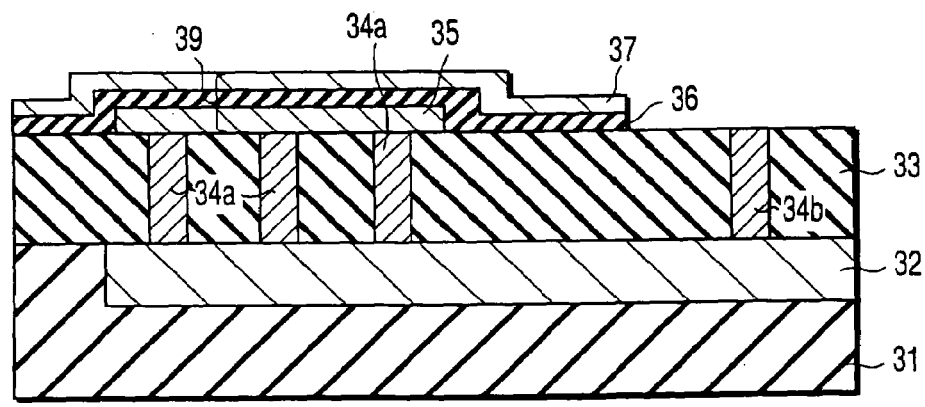
FIG. 8 is a cross sectional view showing a manufacturing step, following the step shown in FIG. 7, of a semiconductor device according to the second embodiment of the present invention.
Figure 9:
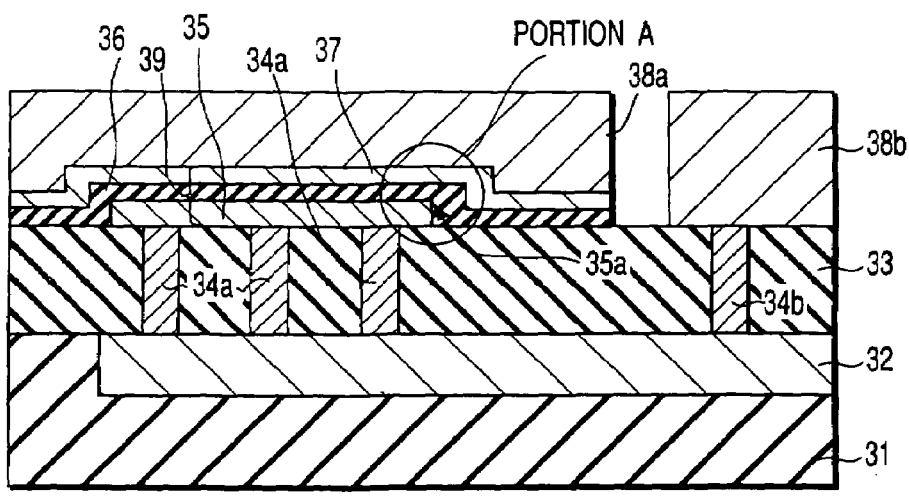
FIG. 9 is a cross sectional view showing a manufacturing step, following the step shown in FIG. 8, of a semiconductor device according to the second embodiment of the present invention.

FIGS. 7 to 9 are cross sectional views showing the process of manufacturing the semiconductor device according to the second embodiment of the present invention. The manufacturing method of the semiconductor device according to the second embodiment of the present invention will now be described with reference to FIGS. 7 to 9.

In the first step, a first wiring 32 made of Al is formed in a $SiO_2$ film 31, as shown in FIG. 7, followed by forming an interlayer insulating film 33 made of, for example, a $SiO_2$ film on the $SiO_2$ film 31 and subsequently forming via holes 34a, 34b in the interlayer insulating film 33. Then, a lower electrode film 35 made of, for example, a TiN film is formed on the interlayer insulating film 33, followed by patterning the lower electrode film 35 such that the lower electrode film 35 selectively remains unremoved on the via holes 34a. In this step, the lower electrode film 35 has a thickness of, for example, 60 nm.

In the next step, a dielectric film 36 made of, for example, a $Ta_2O_5$ film is formed on the lower electrode film 35 and the interlayer insulating film 33 surface, as shown in FIG. 8, followed by forming an upper electrode film 37 made of, for example, a TiN film on the dielectric film 36. The dielectric film 36 has a thickness of, for example, 50 nm, and the upper electrode film 37 has a thickness of, for example, 50 nm.

Then, a resist film (not shown) is formed in the upper electrode film 37 and patterned such that the resist film remains unremoved in the region other than the region above the via hole 34b. After the patterning of the resist film, the upper electrode film 37 and the dielectric film 36 are selectively removed with the patterned resist film used as a mask so as to expose the surface of the via hole 34b and the surface of the interlayer insulating film 33 in the vicinity of the via hole 34b to the outside. As a result, formed is a capacitor 39 consisting of the lower electrode film 35, the dielectric film 36 and the upper electrode film 37. Then, the resist film is removed.

In the next step, a wiring material layer consisting of Al is formed on the upper electrode film 37 and the interlayer insulating film 33, followed by patterning the wiring material layer, as shown in FIG. 9. As a result, formed are a second wiring 38a on the upper electrode film 37 and a third wiring 38b connected to the via hole 34b.

Figure 10:
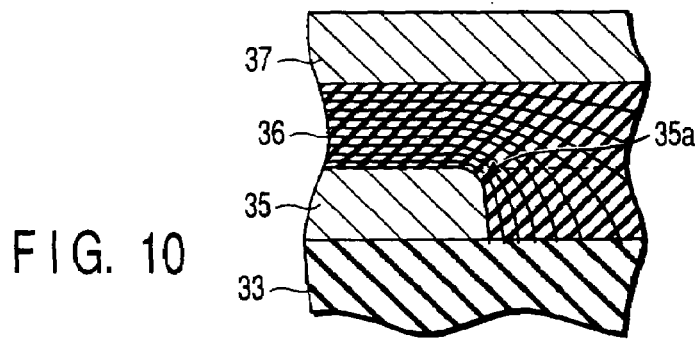
FIG. 10 is a cross sectional view showing in a magnified fashion the portion A shown in FIG. 9, i.e., the electrode edge portion in the second embodiment of the present invention.
Figure 11:
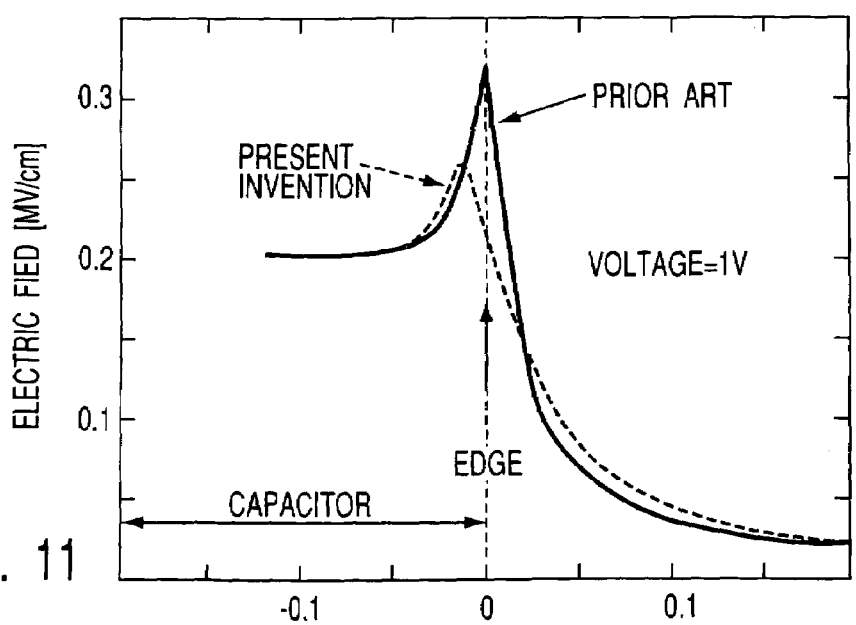
FIG. 11 is a graph comparing the second embodiment of the present invention and the prior art in respect of the electric field intensity in the edge portion of the electrode.

FIG. 10 shows in a magnified fashion the portion A shown in FIG. 9. On the other hand, FIG. 11 is a graph showing the electric field intensity in the edge portion of the electrode in respect of the prior art and the present invention.

As shown in FIG. 10, an edge portion 35a of the lower electrode 35 on the side of the dielectric film 36 has an obtuse angle, with the result that the electric field in the edge portion of the electrode in the present invention is rendered weaker than that in the prior art.

According to the second embodiment described above, the width of the lower electrode 35 is made smaller than that of each of the dielectric film 36 and the upper electrode 37, and the lower electrode 35 is covered with the dielectric film 36 and the upper electrode 37. Because of the particular construction, the edge portion 35a of the lower electrode 35 on the side of the dielectric film 36 is allowed to have an obtuse angle so as to moderate the electric field concentration on the edge portion 64a. It follows that it is possible to improve the reliability of the element.

[Third Embodiment]

The third embodiment is directed to a semiconductor device including a capacitor of a laminate structure with a Cu wiring of a damascene structure, and is featured in that a plurality of capacitors having various capacitance values are formed in the same layer.

FIGS. 12 to 15 are cross sectional views showing the manufacturing process of a semiconductor device according to the third embodiment of the present invention. The manufacturing method of the semiconductor device according to the third embodiment of the present invention will now be described with reference to FIGS. 12 to 15.

Figure 12:
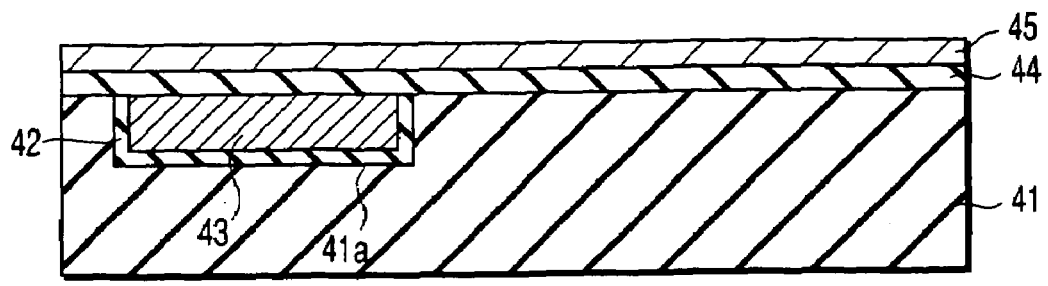
FIG. 12 is a cross sectional view showing a manufacturing step of a semiconductor device according to a third embodiment of the present invention.

In the first step, a wiring groove 41a is formed in a $SiO_2$ film 41, followed by forming a barrier metal layer 42 as shown in FIG. 12. Then, a wiring material layer such as a Cu layer is formed on the barrier metal layer 42 so as to fill the wiring groove 41a. Further, the wiring material layer and the barrier metal layer 42 are planarized by, for example, a CMP method until the surface of the $SiO_2$ film 41 is exposed to the outside so as to form a first wiring 43 buried in the $SiO_2$ film 41.

Then, a dielectric film 44 consisting of, for example, a SiN film is formed on the $SiO_2$ film 41, followed by forming an intermediate electrode film 45 made of, for example, a TiN film or a Ta film on the dielectric film 44.

Figure 13:
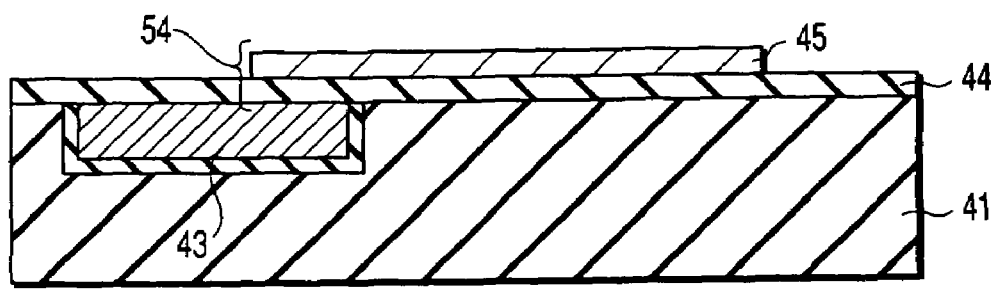
FIG. 13 is a cross sectional view showing a manufacturing step, following the step shown in FIG. 12, of a semiconductor device according to the third embodiment of the present invention.

In the next step, a resist film (not shown) is formed on the intermediate electrode film 45 and, then, patterned as shown in FIG. 13. Then, the intermediate electrode film 45 is selectively removed with the patterned resist film used as a mask such that the intermediate electrode film 45 is partly left unremoved on the first wiring 43 so as to expose the surface of the dielectric film 44 to the outside, followed by removing the resist film. As a result, formed is a first capacitor 54 consisting of the first wiring 43, the dielectric film 44 and the intermediate electrode film 45. It should be noted that the first wiring 43 forms the lower electrode of the first capacitor 54. The first wiring 43 is hereinafter referred to as the lower electrode film.

Figure 14:
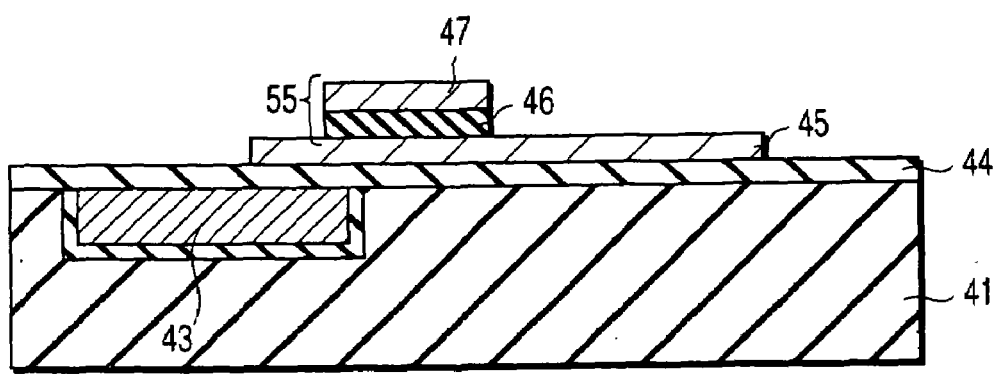
FIG. 14 is a cross sectional view showing a manufacturing step, following the step shown in FIG. 13, of a semiconductor device according to the third embodiment of the present invention.

In the next step, a dielectric film 46 consisting of, for example, a $Ta_2O_5$ film is formed on the intermediate electrode film 45 and the dielectric film 44, as shown in FIG. 14, followed by forming an upper electrode film 47 made of, for example, TaN on the dielectric film 46. Then, a resist film (not shown) is formed on the upper electrode film 47 and, then, patterned. Further, the upper electrode film 47 and the dielectric film 46 are selectively removed with the patterned resist film used as a mask such that the upper electrode film 47 and the dielectric film 46 are left unremoved on only the intermediate electrode film 45, thereby exposing the surfaces of the dielectric film 44 and the intermediate electrode film 45 to the outside. Then, the resist film is removed. As a result, formed is a second capacitor 55 consisting of the intermediate electrode film 45, the dielectric film 46 and the upper electrode film 47. The second capacitor 55 thus formed differs from the first capacitor 54 in capacitance.

Figure 15:
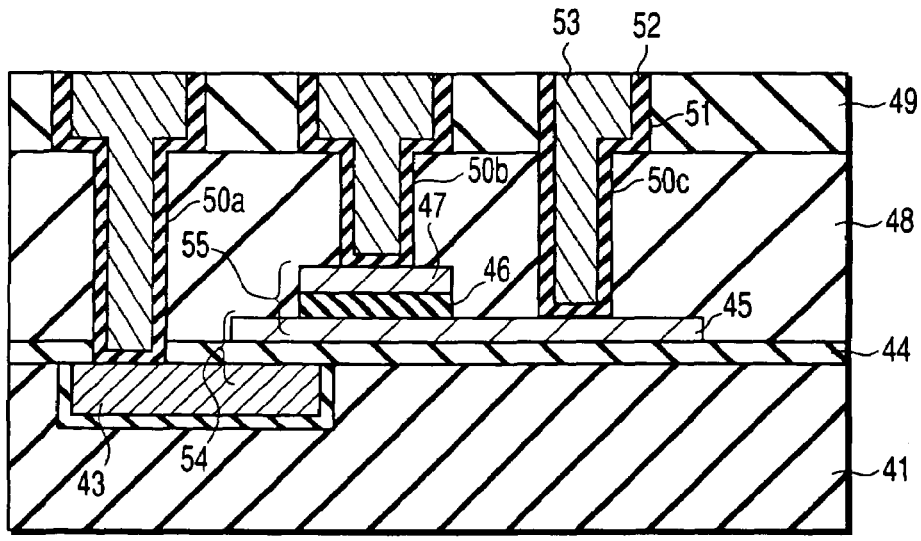
FIG. 15 is a cross sectional view showing a manufacturing step, following the step shown in FIG. 14, of a semiconductor device according to the third embodiment of the present invention.
Figure 16:
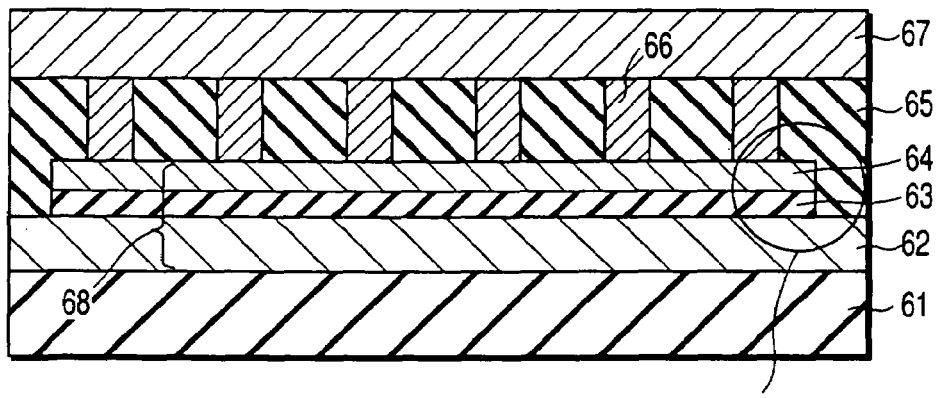
FIG. 16 is a cross sectional view showing a conventional semiconductor device.
Figure 17:
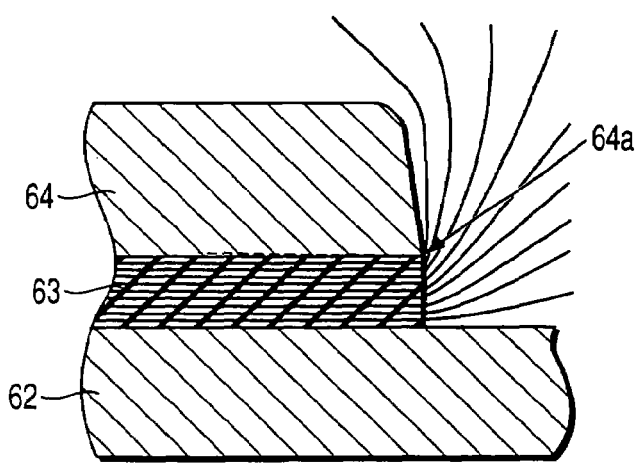
FIG. 17 is a cross sectional view showing in a magnified fashion the portion B shown in FIG. 16, i.e., the edge portion of the electrode in the prior art.

In the next step, a first interlayer insulating film 48 made of, for example, a $SiO_2$ film is formed on the upper electrode film 47, the intermediate electrode film 45 and the dielectric film 44 by a PECVD method, followed by planarizing the first interlayer insulating film 48 by a CMP method, as shown in FIG. 15. Then, a second interlayer insulating film 49 is formed on the planarized first interlayer insulating film 48. The second interlayer insulating film 49 is formed of an insulating film having a low dielectric constant such as a SiN film, with the result that it is possible to lower the capacitance between the wirings.

Then, the first interlayer insulating film 48 is selectively removed by the photolithography and RIE so as to form via holes 50a, 50b, 50c within the first interlayer insulating film 48. It should be noted that the via hole 50a is connected to the lower electrode 43, and the via hole 50b is connected to the upper electrode 47. Further, the via hole 50c is connected to the intermediate electrode film 45.

In the next step, the second interlayer insulating film 49 is selectively etched so as to form wiring grooves 51 in the second interlayer insulating film 49, said grooves being positioned on the via holes 50a, 50b, 50c formed in the first interlayer insulating film 48.

Then, a barrier metal layer 52 made of, for example, TaN is formed in the wiring grooves 51, followed by forming a wiring material layer such as a Cu layer on the barrier metal layer 52, with the result that the via holes 50a, 50b, 50c and the wiring grooves 51 are filled with the wiring material. Further, the barrier metal layer 52 and the wiring material layer are planarized by, for example, a CMP method until the surface of the second interlayer insulating film 49 is exposed to the outside, thereby forming a second wiring 53.

According to the third embodiment described above, a plurality of capacitors 54, 55 are formed in a laminate structure within a single layer. Since these capacitors 54 and 55 differ from each other in the capacitance, it is possible to form a plurality of capacitors having various capacitance values within a single layer. It follows that it is possible to provide a large capacitance without increasing the capacitor area by combining a plurality of capacitors, thereby coping with the conventional pairing problem. It should also be noted that, if a capacitor having a small capacitance is selected, it is possible to increase, for example, the read out speed.

As described above, it is possible in the present invention to form a plurality of capacitors having at least two kinds of capacitance values, thereby meeting the various demands. Also, since the capacitor is of a laminate structure, it is possible to diminish the chip area so as to promote the fineness of the element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a first wiring formed in a first insulating film;
   a second insulating film formed on the first insulating film;
   a first electrode film selectively formed on the second insulating film in a manner to overlap partially with the first wiring;

a third insulating film selectively formed on the first electrode film;

a second electrode film formed on the third insulating film such that the second electrode film faces the first electrode film;

a fourth insulating film formed on the first and second electrode films and the second insulating film;

a fifth insulating film formed on the fourth insulating film;

second, third and fourth wirings formed in the fifth insulating film;

a first connecting member formed in the fourth and second insulating films to electrically connect the second wiring to the first wiring;

a second connecting member formed in the fourth insulating film to electrically connect the third wiring to the second electrode film; and a third connecting member formed in the fourth insulating film to electrically connect the fourth wiring to the first electrode film.

2. The semiconductor device according to claim 1, wherein the first wiring, the first electrode film and the second insulating film form a first capacitor, and the first and second electrodes and the third insulating film form a second capacitor, the first and second capacitors differing from each other in the capacitance.

3. The semiconductor device according to claim 1, wherein the fifth insulating film is formed of an insulating film having a low dielectric constant.

* * * * *